United States Patent [19]
Tatumi et al.

[11] Patent Number: 5,899,376
[45] Date of Patent: May 4, 1999

[54] TRANSFER OF FLUX ONTO ELECTRODES AND PRODUCTION OF BUMPS ON ELECTRODES

[75] Inventors: Kouhei Tatumi; Kenji Shimokawa; Eiji Hashino, all of Kawasaki, Japan

[73] Assignee: Nippon Steel Corporation, Tokyo, Japan

[21] Appl. No.: 08/677,392

[22] Filed: Jul. 9, 1996

[30] Foreign Application Priority Data

Jul. 11, 1995 [JP] Japan ................................. 7-175218

[51] Int. Cl.⁶ ........................................................ B23K 1/20
[52] U.S. Cl. ............................ 228/223; 228/36; 228/106
[58] Field of Search ................................ 228/36, 180.22, 228/223, 106

[56] References Cited

U.S. PATENT DOCUMENTS

| | | | |
|---|---|---|---|
| 4,104,102 | 8/1978 | Eagon et al. | 156/298 |
| 4,206,542 | 6/1980 | Reavill | 29/877 |
| 4,332,341 | 6/1982 | Minetti | 228/180 A |
| 4,346,516 | 8/1982 | Yokouchi et al. | 29/845 |
| 4,462,534 | 7/1984 | Bitaillou et al. | 228/180 A |
| 4,871,110 | 10/1989 | Fukasawa et al. | 228/245 |
| 5,279,045 | 1/1994 | Odashima et al. | 34/10 |
| 5,284,287 | 2/1994 | Wilson et al. | 228/180.2 |
| 5,410,807 | 5/1995 | Bross et al. | 29/843 |
| 5,431,332 | 7/1995 | Kirby et al. | 228/246 |
| 5,435,481 | 7/1995 | Da Costa Alves et al. | 228/36 X |
| 5,435,482 | 7/1995 | Variot et al. | 228/106 |
| 5,445,313 | 8/1995 | Boyd et al. | 228/180.22 X |
| 5,615,823 | 4/1997 | Noda et al. | 228/103 |
| 5,657,528 | 8/1997 | Sakemi et al. | 29/430 |
| 5,695,667 | 12/1997 | Eguchi et al. | 219/388 |

FOREIGN PATENT DOCUMENTS

| | | | |
|---|---|---|---|
| 0 427 384 A2 | 5/1991 | European Pat. Off. | H01L 21/603 |
| 5-259224 | 10/1993 | Japan | H01L 21/60 |
| 6-344132 | 12/1994 | Japan | B23K 3/06 |
| 7-226425 | 8/1995 | Japan | H01L 21/60 |

OTHER PUBLICATIONS

IBM Technical Disclosure Bulletin, vol. 34, No. 2, pp. 356–357, Jul. 1991.

Primary Examiner—Kenneth J. Ramsey
Attorney, Agent, or Firm—Pollock, Vande Sande & Amernick

[57] ABSTRACT

A process of transferring a flux on electrodes of a semiconductor chip, a film carrier, or a substrate, the process comprising: using a transfer apparatus including a transfer baseplate having protrusions corresponding to said electrodes; dipping the tips of the protrusions of the transfer baseplate in a flux bath to cause the flux to stick to the tips; then aligning the protrusions of the transfer baseplate with the electrodes; and transferring the stuck flux onto the electrodes from the tips.

6 Claims, 2 Drawing Sheets

Fig.1(a)
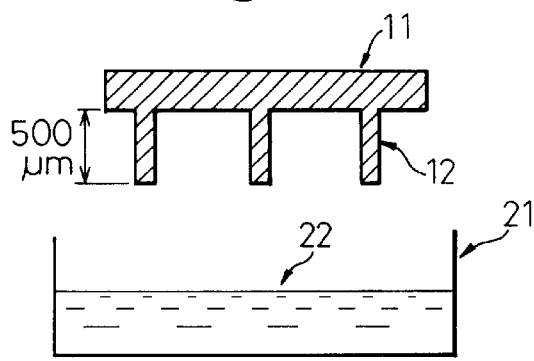
Fig.1(b)
Fig.1(c)
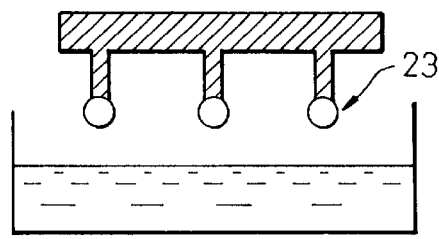
Fig.1(d)
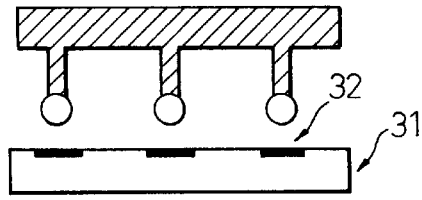
Fig.1(e)
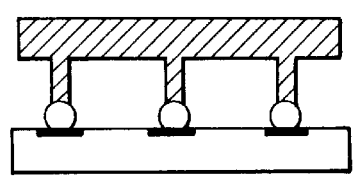
Fig.1(f)
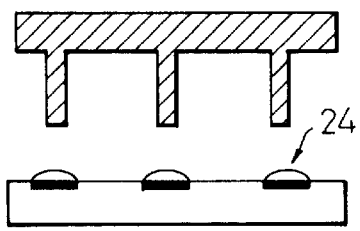
Fig.1(g)
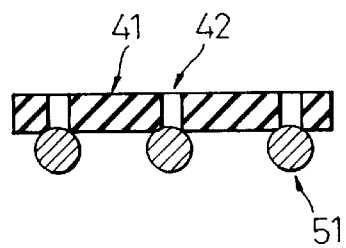
Fig.1(h)
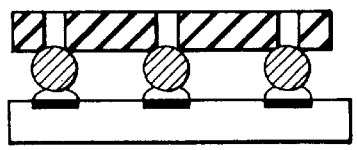
Fig.1(i)
Fig.1(j)
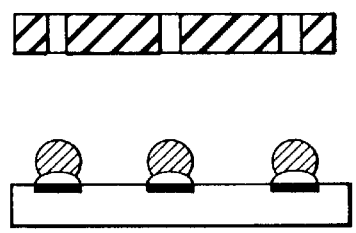

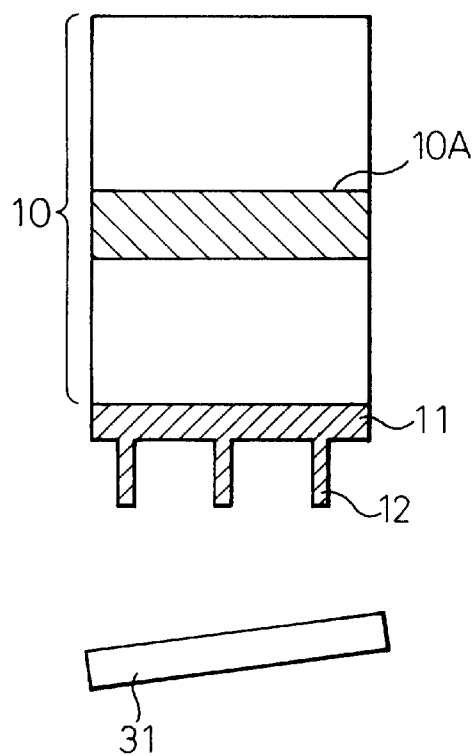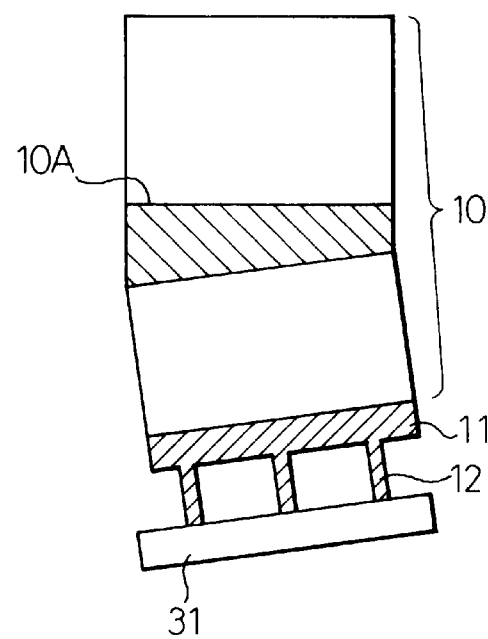

TRANSFER OF FLUX ONTO ELECTRODES AND PRODUCTION OF BUMPS ON ELECTRODES

BACKGROUND OF THE INVENTION

1. Field of the Invention

The present invention relates to a process and an apparatus for transferring a flux onto electrodes and a process and an apparatus for producing small metal bumps of a low melting point metal or metal alloy.

2. Description of the Related Art

The popularization of portable information devices and portable video cameras increases the need for miniaturized semiconductor packages. The advancing performance of LSI's also increases the number of electrodes. To achieve the miniaturized and multi-terminal packaging, a flip-chip bonding method is used to directly mount a chip on small-pitched electrodes of a substrate. A ball grid array (BGA) and a chip size package (CSP) have also been developed to realize a multi-terminal packaging, not requiring an extremely small pitch, by using a surface arrangement of terminals instead of a peripheral arrangement.

In this conventional technology, it is necessary to form connection terminals, or bumps, of a solder or other low melting point metal or metal alloy, on the electrodes of a substrate, etc. It is an advantageous bump forming method to form bumps by using balls of a solder or other low melting point metal or metal alloy. To form bumps from balls, in order to provide strong bond between the bumps and the electrodes, it is necessary that a flux is applied or transferred onto the electrodes, the balls are provisionally fixed to the electrodes, and the balls are then heated to above the melting point temperature thereof, thereby being melted to form bumps bonded to the electrodes.

The conventional technology has a problem in that, if a flux is also applied or transferred to portions other than electrodes, balls may flow down from the electrodes when melted by heating. This phenomenon can be prevented by transferring a flux only to the electrodes. U.S. Pat. No. 5,284,287 discloses a process comprising holding solder balls having a diameter of 500 to 700 $\mu$m on an arrangement baseplate, moving the arrangement baseplate with the balls held thereon to above a flux bath, lowering the arrangement baseplate until portions of the balls are dipped in the flux bath to cause the flux to stick to the balls. The balls having the flux sticking thereto are pressed against the substrate electrodes to provisionally fix the balls to the electrodes. The flux is thus only applied on the electrodes to which the balls are provisionally fixed. The provisionally fixed balls do not flow down from the electrode when melted by heating.

This process of transferring a flux to electrodes only, however, becomes difficult to perform when the ball have a diameter less than 500 $\mu$m. Specifically, when the balls have a smaller diameter, the distance between the arrangement baseplate which holds the balls and the tip portions of the balls to be dipped in the flux bath becomes smaller, so that the flux undesirably also sticks to the arrangement baseplate when the balls are dipped in the flux bath. When a baseplate having portions on which the flux is deposited is used again to hold another set of balls, the balls may also stick to the portions causing reduction in the reliability of the process of forming bumps on the electrodes. If the balls have a further smaller diameter, it becomes difficult to cause the flux to stick to the balls in only limited portions of the balls in a well-controlled manner. A problem then arises in that, if an excessive amount of the flux sticks to the balls, the sticking force causes the balls to drop off the arrangement baseplate into the flux bath.

SUMMARY OF THE INVENTION

It is an object of the present invention to provide a process and an apparatus for precisely transferring a flux onto electrodes only, when producing bumps on the electrodes from balls having a diameter less than 500 $\mu$m.

It is another object of the present invention to provide a process and an apparatus for producing bumps using the flux transferring process or apparatus.

To achieve the object according to the present invention, there is provided a process of transferring a flux onto electrodes of a semiconductor chip, a film carrier, or a substrate, the process comprising:

using a transfer apparatus including a transfer baseplate having protrusions corresponding to said electrodes;

dipping tips of the protrusions of the transfer baseplate in a flux bath to cause the flux to stick to the tips;

then aligning the protrusions of the transfer baseplate with the electrodes; and transferring the stuck flux onto the electrodes from the tips.

There is also provided a process of producing small metal bumps on electrodes of a semiconductor chip, a film carrier, or a substrate, the process comprising:

transferring a flux onto the electrodes by a process comprising using a transfer apparatus including a transfer baseplate having protrusions corresponding to said electrodes; dipping tips of the protrusions of the transfer baseplate in a flux bath to cause the flux to stick to the tips; then aligning the protrusions of the transfer baseplate with the electrodes; and transferring the stuck flux onto the electrodes from the tips;

simultaneously arranging and holding small metal balls of a low melting point metal or metal alloy on an arrangement baseplate;

aligning the small metal balls held on the arrangement baseplate with the electrodes having the transferred flux thereon;

then pressing the small metal balls held on the arrangement baseplate against the electrodes having the transferred flux thereon to simultaneously provisionally fix the small metal balls to the electrodes;

then heating the provisionally fixed small metal balls to melt them, thereby forming small metal bumps of the metal or metal alloy bonded to the electrodes.

There is also provided an apparatus for transferring a flux onto electrodes of a semiconductor chip, a film carrier, or a substrate, the apparatus comprising:

a transfer baseplate having protrusions thereon;

a mechanism for causing the flux to stick to tips of the protrusions of the transfer baseplate;

a mechanism for aligning the tips of the protrusions with the electrodes; and a mechanism for transferring the stuck flux onto the electrodes.

There is also provided an apparatus for producing small metal bumps on electrodes of a semiconductor chip, a film carrier, or a substrate, the apparatus comprising:

an apparatus for transferring a flux onto the electrodes comprising a transfer baseplate having protrusions thereon; a mechanism for causing the flux to stick to tips of the protrusions of the transfer baseplate; a mechanism for aligning the tips of the protrusions with the electrodes; and a mechanism for transferring the stuck flux onto the electrodes;

a mechanism for simultaneously arranging and holding small metal balls of a low melting point metal or metal alloy on an arrangement baseplate in positions corresponding to the electrodes;

a mechanism for aligning the small metal balls held on the arrangement baseplate with the electrodes having the transferred flux thereon; and a mechanism for pressing the small metal balls held on the arrangement baseplate against the electrodes having the transferred flux thereon to simultaneously provisionally fix the small metal balls to the electrodes.

BRIEF DESCRIPTION OF THE DRAWINGS

FIGS. 1(a) to 1(j) are cross-sectional views showing process steps for transferring a flux onto electrodes and producing bumps on the electrodes, according to the present invention; and FIG. 2(a) and 2(b) are cross-sectional views showing a preferred transfer head having a resilient member, according to the present invention.

DESCRIPTION OF THE PREFERRED EMBODIMENTS

The present invention uses an arrangement baseplate having protrusions disposed in the positions corresponding to those of the substrate electrodes. The tips of the protrusions of the arrangement baseplate are dipped in a flux bath to cause the flux to stick to the tips, the tips having the flux sticking thereto are aligned to the electrodes, and the flux is then transferred from the tips to the electrodes.

The present invention is most advantageously applied to metal balls having a diameter less than 500 µm but, of course, may also be applied to metal balls having greater diameters such as 760 µm.

The protrusions may have any form having tips to which a flux can be transferred in an amount necessary and sufficient to cover the electrodes. Therefore, the tip portions of the protrusions preferably have a sectional area corresponding to that of the electrodes. In order to ensure easy dipping of the tips in a flux bath, the protrusions preferably have a height of 200 µm or more, more preferably 500 µm or more, as shown in FIG. 1(a).

The flux transfer baseplate may be made of any material which allows the protrusions to be formed therefrom, and can be made of glass or other ceramics, stainless steel or other metals and metal alloys, or plastics, etc. The electrodes to which a flux is to be transferred are those of a semiconductor chip, a film carrier, a substrate, or the like. The substrate may be a printed circuit board made of glass epoxy, glass, ceramics, etc., or a flexible substrate made of polyimide, or other substrates. The small bumps may be made of solders having various compositions, or other low melting point metal or metal alloys, having a melting point not higher than 400° C.

To carry out the flux transfer process of the present invention, the flux transfer apparatus of the present invention is essentially composed of:

1) a transfer baseplate having protrusions for transferring the flux and disposed in the positions corresponding to the electrodes;

2) a mechanism for dipping only the tips of the protrusions in a flux bath;

3) a mechanism for aligning the tips of the protrusions of the transfer baseplate with the electrodes using an image processor or the like to recognize the respective positions of the electrodes; and 4) a mechanism for moving the transfer baseplate having the protrusion tips to which the flux is sticking, to the positions of the electrodes and transfer the flux to the electrodes.

A transfer baseplate 11 may be mounted on a transfer head 10 having a resilient member 10A as shown in FIG. 2(a) to allow flexible bending of the head 10 to ensure stable contact of the protrusion tips with a substrate 31 even when the substrate 31 is not exactly parallel to the transfer baseplate 11, as shown in FIG. 2(b), in order to transfer a fixed amount of the flux onto the electrodes. The resilient member 10A may be a spring, or may be made of resilient polymers such as rubber, or other resilient materials.

After repeated flux transfer operations, the flux may occasionally be adhered to the protrusion tips. In this case, the protrusion tips may be dipped in a solvent for the flux to remove the adhered flux from the tips. Ultrasonic vibrations may be applied to the solvent to facilitate removal of the adhered flux.

To carry out the bump production process of the present invention, the apparatus for producing bumps of the present invention is essentially composed of:

1) the flux transfer apparatus of the present invention;

2) a mechanism for simultaneously arranging and holding small metal balls from a mounting container on an arrangement baseplate at the positions corresponding to those of the electrodes by suction, electrostatic force, magnetic force, etc;

3) a mechanism for recognizing the positions of the small metal balls held on the arrangement baseplate and the positions of the electrodes by image analysis, etc., and aligning the former with the latter; and 4) a mechanism for pressing the small metal balls held on the arrangement baseplate against the electrodes of a semiconductor chip, a film carrier, or a substrate, having the transferred flux thereon to simultaneously provisionally fix the small metal balls to the electrodes.

A transfer apparatus in which a transfer baseplate is raised and lowered may be either integrated with or separated from the mechanism for pressing the small balls held on the arrangement baseplate against the electrodes, in which mechanism the arrangement baseplate is also raised and lowered. Preferably, the transfer apparatus and the mechanism for pressing are separated to improve the apparatus throughput and the productivity. The balls may be transferred onto the electrodes either by moving the arrangement baseplate to the position of a semiconductor chip or the like having the electrodes, or by moving the semiconductor chip or the like having the electrodes to the position of the arrangement baseplate. A mechanism for conveying a semiconductor chip, a film carrier, or a substrate may be integrated with the apparatus according to the present invention. A image analysis can be commonly used for both a transfer apparatus and a bump production apparatus.

A mechanism for heating a semiconductor chip, a film carrier, or a substrate placed on a holder may also be integrated with the present inventive apparatus so that heating of the small metal balls can be performed without conveying the balls to a furnace or the like.

When the small metal balls have a reduced size, excess balls other than those to be transferred to the electrodes may occasionally be stuck to the arrangement baseplate or to the balls arranged and held on the arrangement baseplate. This phenomenon becomes significant when the balls have a size of 300 μm or less, particularly 150 μm or less. This phenomenon can be avoided by providing a mechanism for removing excess balls by ultrasonic vibration (as disclosed in Japanese Unexamined Patent Publication (Kokai) No. 7-226425) in an arrangement head which holds an arrangement baseplate of a bump production apparatus of the present invention.

EXAMPLE

The process for transferring a flux onto the electrodes only and the process for producing bumps using the former, according to the present invention, will be described in details with reference to the attached drawings.

FIGS. 1(a) to 1(j) show a process steps for transferring a flux to the electrodes only and a process for producing solder bumps using the former. An object onto which a flux is transferred is a printed circuit board made of glass-epoxy and having 350 electrodes formed thereon. Each of the electrodes is formed as a 50 μm by 50 μm square pad. 350 electrode pads are disposed at a pitch, or an interval, of 100 μm. Bumps are produced by using balls of a eutectic solder having a composition of Sn 60 wt % and Pb 40 wt %, a melting point of 188° C., and a diameter of 45 μm.

A flux is transferred onto the electrodes only, by using a flux transfer baseplate having protrusions thereon at the positions corresponding to those of the electrodes. In this example, the flux transfer baseplate is made of glass. The protrusion are in the form of a cylindrical column having a diameter of 50 μm and a height of 500 μm.

The flux transfer process and the bump production process will be described in the sequence of the drawings.

(a) A flux transfer baseplate 11 is moved to above a flux vessel 21 containing a flux 22.

(b) The flux transfer baseplate 11 is lowered toward the flux 22 until only the tips of the protrusions 12 of the transfer baseplate 11 are dipped in the flux 22.

(c) The transfer baseplate 11 is raised to cause droplets 23 of the flux 22 to be stuck to the tips of the protrusions 12.

(d) The transfer baseplate 11 is moved to above electrodes or electrode pads 32 of a substrate 31 to align the tips of the protrusions 12 with the electrode pads 32.

(e) The transfer baseplate 11 is lowered toward the electrodes pads 32 to bring the droplets 23 of the flux 22 into contact with the electrode pads 32.

(f) The transfer baseplate 11 is raised away from the electrodes 32, leaving the transferred flux 24 on the electrode pads 32.

(g) Eutectic solder balls 51 are simultaneously attracted to and held on an arrangement baseplate 41 by suction through small suction holes 42 formed therein at the positions corresponding to those of the electrodes 32 and the balls 51 are aligned with the electrode pads 32 having the transferred flux 24 thereon.

(h) The arrangement baseplate 41 is lowered toward the substrate 31, or a printed circuit board, to press the balls 51 by the arrangement baseplate 41 against the substrate 31, thereby provisionally fixing the balls 51 to the electrodes 32.

(i) The arrangement baseplate 41 is raised away from the substrate 31, leaving the balls 51 provisionally fixed to the electrodes 32 having the transferred flux 24 thereon.

(j) The substrate 31 having the electrodes 32 to which the balls are provisionally fixed is conveyed to a furnace, in which the solder balls 51 are heated to 200° C., which is higher than the melting point of the solder balls 51, to fuse the solder balls 51. After being removed from the furnace, the substrate 31 is subjected to cleaning to remove the flux to provide solder bumps 52 firmly bonded to the electrodes 32 of the substrate 31.

As herein described above, the present invention produces small metal bumps by bonding small metal balls having a diameter of less than 500 μm to the electrodes of a substrate using a flux, while preventing the flux from sticking to the substrate and also preventing the small metal balls from flowing down from the electrodes. A flux is controllably transferred onto the electrodes only and small metal balls of a low melting point metal or metal alloy are bonded to the electrodes to produce small metal bumps. These small bumps provides connection terminals of a semiconductor chip, a film carrier, or a substrate, which can be advantageously used to produce a miniaturized electronic devices or parts with high productivity.

We claim:

1. A process of transferring a flux onto electrodes of a semiconductor chip, a film carrier, or a substrate, the process comprising:

using a transfer apparatus including a transfer baseplate having protrusions corresponding to said electrodes and wherein the transfer baseplate is mounted on a transfer head having a resilient member to allow flexible bending of the transfer head to ensure stable contact of the tips of the protrusions with a semiconductor chip, a film carrier or a substrate even when they are not exactly parallel to the transfer baseplate in order to transfer a fixed amount of the flux onto the electrodes;

dipping the tips of the protrusions of the transfer baseplate in a flux bath to cause the flux to stick to the tips;

then aligning the protrusions of the transfer baseplate with the electrodes; and transferring the stuck flux onto the electrodes from the tips.

2. A process of producing small metal bumps on electrodes of a semiconductor chip, a film carrier, or a substrate, the process comprising:

transferring a flux onto the electrodes by a process comprising using a transfer apparatus including a transfer baseplate having protrusions corresponding to said electrodes; dipping the tips of the protrusions of the transfer baseplate in a flux bath to cause the flux to stick to the tips; then aligning the protrusions of the transfer baseplate with the electrodes; and transferring the stuck flux onto the electrodes from the tips;

simultaneously arranging and holding small metal balls of a low melting point metal or metal alloy on an arrangement baseplate;

aligning the small metal balls held on the arrangement baseplate with the electrodes having the transferred flux thereon;

removing excess balls by a mechanism provided in an arrangement head which holds an arrangement baseplate;

then pressing the small metal balls held on the arrangement baseplate against the electrodes having the transferred flux thereon to simultaneously provisionally fix the small metal balls to the electrodes; and then heating the provisionally fixed small metal balls to melt them, thereby forming small metal bumps of the metal or metal alloy bonded to the electrodes;

wherein the transfer baseplate is mounted on a transfer head having a resilient member to allow flexible bending of the transfer head to ensure stable contact of the tips of the protrusions with a semiconductor chip, a film carrier or a substrate even when they are not exactly parallel to the transfer baseplate in order to transfer a fixed amount of flux onto the electrodes.

3. The process of claim 2 wherein excess balls are removed by ultrasonic vibration.

4. An apparatus for transferring a flux onto electrodes of a semiconductor chip, a film carrier, or a substrate, the apparatus comprising:

a transfer baseplate having protrusions thereon and wherein the transfer baseplate is mounted on a transfer head having a resilient member to allow flexible bending of the transfer head to ensure stable contact of the tips of the protrusions with a semiconductor chip, a film carrier or a substrate even when they are not exactly parallel to the transfer baseplate in order to transfer a fixed amount of the flux onto the electrodes;

a mechanism for causing the flux to stick to the tips of the protrusions of the transfer baseplate;

a mechanism for aligning the tips of the protrusions with the electrodes; and a mechanism for transferring the stuck flux onto the electrodes.

5. An apparatus for producing small metal bumps on electrodes of a semiconductor chip, a film carrier, or a substrate, the apparatus comprising:

an apparatus for transferring a flux onto the electrodes comprising a transfer baseplate having protrusions thereon; a mechanism for causing the flux to stick to the tips of the protrusions of the transfer baseplate; a mechanism for aligning the tips of the protrusions with the electrodes; and a mechanism for transferring a stuck flux onto the electrodes;

a mechanism for simultaneously arranging and holding small metal balls of a low melting point metal or metal alloy on an arrangement baseplate in positions corresponding to the electrodes;

a mechanism for aligning the small metal balls held on the arrangement baseplate with the electrodes having the transferred flux thereon;

a mechanism for removing excess balls provided in an arrangement head which holds an arrangement baseplate; and a mechanism for pressing the small metal balls held on the arrangement baseplate against the electrodes having the transferred flux thereon to simultaneously provisionally fix the small metal balls to the electrodes;

wherein the transfer baseplate is mounted on a transfer head having a resilient member to allow flexible bending of the transfer head to ensure stable contact of the tips of the protrusions with a semiconductor chip, a film carrier or a substrate even when they are not exactly parallel to the transfer baseplate in order to transfer a fixed amount of flux onto the electrodes.

6. The apparatus of claim 5 wherein the mechanism for removing excess balls is ultrasonic vibration.

* * * * *